United States Patent [19]
Shishiguchi et al.

[11] Patent Number: 5,783,257
[45] Date of Patent: Jul. 21, 1998

[54] METHOD FOR FORMING DOPED POLYSILICON FILMS

[75] Inventors: Seiichi Shishiguchi, Tokyo-To; Kazuhide Hasebe; Nobuaki Shigematsu, both of Yamanashi-Ken, all of Japan

[73] Assignees: Tokyo Electron Limited, Tokyo; Electron Tohoku Limited, Tokyo-To; NEC Corporation, Iwate-ken, all of Japan

[21] Appl. No.: 864,907

[22] Filed: May 29, 1997

Related U.S. Application Data

[63] Continuation of Ser. No. 490,090, Jun. 13, 1995, abandoned.

[30] Foreign Application Priority Data

Jun. 17, 1994 [JP] Japan .................. 6-159532

[51] Int. Cl.$^6$ .................................................. C23C 16/22
[52] U.S. Cl. .................... 427/255.2; 427/255.1; 427/255; 438/684; 438/764
[58] Field of Search .................. 427/255.2, 255.1, 427/255; 438/684, 764; 148/DIG. 122

[56] References Cited

U.S. PATENT DOCUMENTS

| | | | |
|---|---|---|---|
| 4,441,249 | 4/1984 | Alspector et al. | 437/233 |
| 5,080,933 | 1/1992 | Grupen-Shemansky et al. | 427/255.1 |

FOREIGN PATENT DOCUMENTS

| | | |
|---|---|---|
| 60-35746 | 2/1985 | Japan . |
| 01-268047 | 10/1989 | Japan . |
| 3-76022 | 12/1991 | Japan . |
| 5-3258 | 1/1993 | Japan . |
| 6-140324 | 5/1994 | Japan . |
| 6-45883 | 6/1994 | Japan . |

OTHER PUBLICATIONS

English–language Abstract for Japanese KOKAI No. 62–99463.
English–language Abstract for Japanese KOKAI No. 62–226631.

*Primary Examiner*—Roy V. King
*Attorney, Agent, or Firm*—Beveridge, Degrandi, Weilacher & Young, LLP

[57] ABSTRACT

A number of wafers are loaded into a reaction vessel on a wafer boat; monosilane gas, phosphine gas and $N_2O$ gas are supplied to form amorphous silicon film doped with, e.g., phosphorus; and then the wafers are annealed in, e.g., a different reaction tube to polycrystallize the amorphous silicon film. Os (Oxygen) generated by decomposition of $N_2O$ are taken into the film. The Os become nuclei of the silicon crystals, and the crystals become fine and have size uniformity. As a result, high uniformity of resistance values of micronized devices of the polysilicon film can be obtained. Resistance values of the polysilicon film can be easily controlled by addition of oxygen. As a result, high uniformity of resistance values of micronized devices of the polysilicon film can be obtained.

3 Claims, 2 Drawing Sheets

METHOD FOR FORMING DOPED POLYSILICON FILMS

This application is a continuation of application Ser. No. 08/490,090, filed Jun. 13, 1995, now abandoned, which application is entirely incorporated herein by reference.

BACKGROUND OF THE INVENTION

The present invention relates to a film forming method.

A semiconductor device is constituted with various thin films laid one on another. Phosphorus (P)-doped polysilicon films are one of these thin films. The phosphorus-doped polysilicon films are used as resistor elements, gates, wirings, etc. As a forming process for the P-doped polysilicon films low pressure CVD (Chemical Vapor Deposition) is widely used because of its good controllability and the advantage that no damage is caused to substrates in ion implantation.

The conventional processing for forming P-doped polysilicon films by low pressure CVD using a vertical thermal processing apparatus will be explained hereinafter. In this processing, a number (e.g., 150 sheets) of semiconductor wafers (hereinafter called "wafer") are loaded into a reaction tube on a wafer boat; a temperature inside the reaction tube is set at, e.g., a temperature above 500° C. while monosilane ($SiH_4$) gas as a film forming gas and phosphine ($PH_3$) gas as a doping gas are fed into the reaction tube; and polysilicon films doped with phosphorus are formed in a required vacuum. Processing in which disilane ($Si_2H_6$) gas is used as a film forming gas in place of the monosilane gas to form phosphorus-doped amorphous silicon films, and the thin films are annealed at a temperature of, e.g., 600°–1000° C. and polycrystallized is also used.

The pattern line width of semiconductor devices are recently increasingly micronized. The line width of resistor elements of phosphorus doped polysilicon film is also increasingly micronized, e.g., 2 μm. As the pattern line width is thus micronized, resistance value disuniformity of resistor elements are conspicuously reflected in products as characteristic disuniformity of devices including the resistor elements. Accordingly very high resistance value (sheet resistance) uniformity is required of the above-described polysilicon films in intra-plane of wafers, inter-wafer planes, and inter-batch of wafers.

Here, one factor the resistance value of the polysilicon film depends on is sizes of the silicon crystal. Relatively large crystal sizes cause resistance disuniformity between polysilicon micronized resistor elements. Reasons for this is as follows. That is, even if a polysilicon film is an aggregate of silicon crystals of the same size, when the wafer is cut into respective devices, the respective micronized resistor elements of the polysilicon film have different crystal numbers from each other as shown in FIGS. 4A and 4B, respectively. Disuniformity of the crystal numbers 101 between the micronized resistor elements is higher as the crystal size (e.g., 0.2 μm) is larger. Here in doping, e.g., phosphorus, phosphorus 102 is deposited on the interfaces of the silicon crystals to raise a resistance value of the thin film, which lowers resistance value uniformity among the micronized resistor elements as disuniformity of the crystal numbers is higher (above 0.5%). As a result, yields of devices are low.

SUMMARY OF THE INVENTION

Under these circumstances, the present invention was made, and object of the present invention is provided a film forming method which minimizes disuniformity of crystal numbers to enhance uniformity of resistance values of a polysilicon film of semiconductor devices.

According to the present invention, objects to be processed are loaded into a reaction vessel maintained air-tight, and a film forming gas and a doping gas are fed into the reaction vessel to form silicon films on the objects to be processed by chemical vapour reaction, a gas containing a component which hinders growth of silicon crystals is supplied into the reaction vessel incessantly throughout film forming processing.

According to the present invention, the gas containing a component which hinders growth silicon crystals is one selected out of $N_2O$, $O_2$, $O_3$ and $CO_2$.

By feeding a silane-based gas, and $N_2O$ gas into the reaction vessel to form films on objects to be processed, silicon film which provides uniform resistance values among micronized devices. This film formation includes a case where amorphous silicon film, for example, is formed using a silane-based gas, e.g., monosilane, and then the amorphous film is heat-treated, e.g., annealed to be polycrystallized, and a case where the film formation is conducted at a temperature which allows the polycrystallization to form polysilicon film. The uniformity of resistance values of the film is that oxygen atoms generated by decomposition of, e.g., $N_2O$ become nuclei for silicon crystals, whereby the silicon crystals have small sizes, and disuniformity of the sizes is low.

DETAILED DESCRIPTION OF MOST PREFERRED EMBODIMENTS

Figure 1:
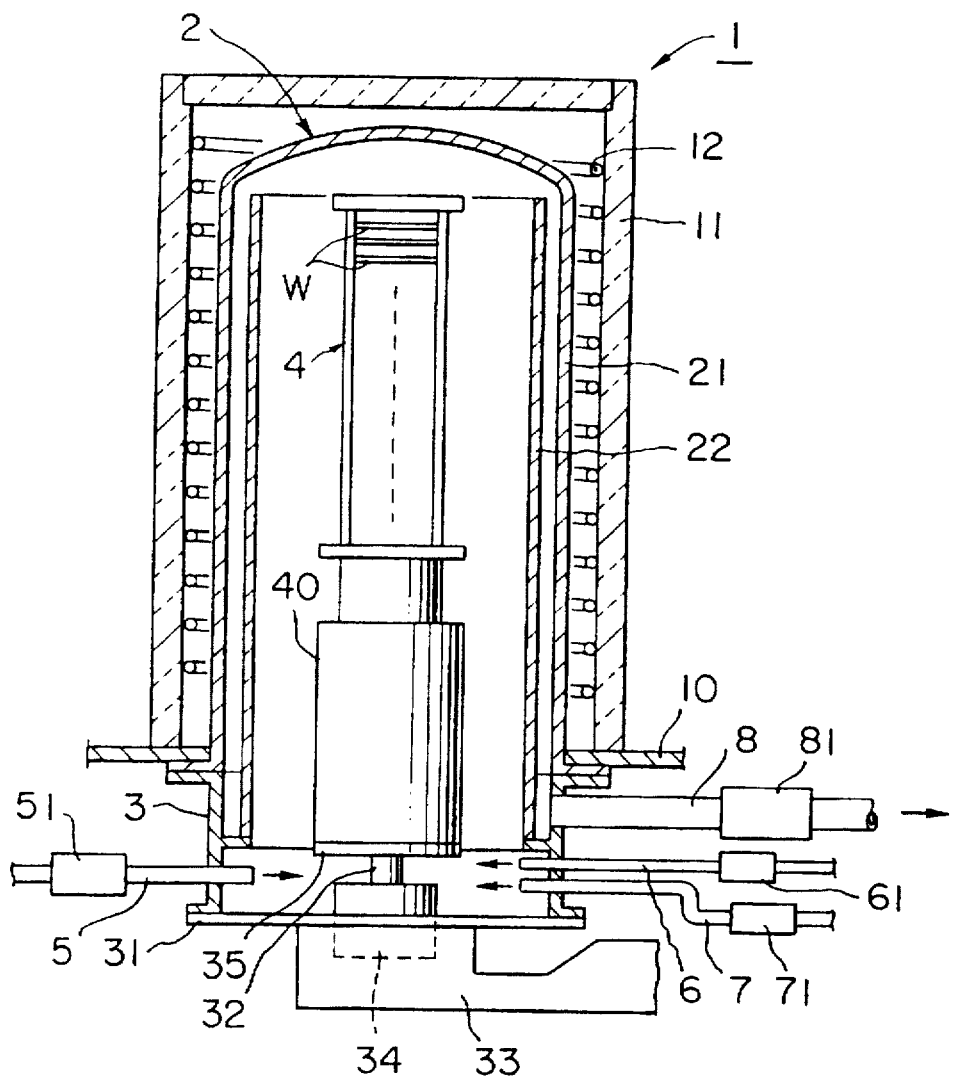
FIG. 1 is a vertical sectional view of one example of a film forming apparatus for use in carrying out the film forming method according to the present invention.

FIG. 1 is a vertical sectional view of one example of the film forming apparatus for carrying out the film forming method according to the present invention. A heating furnace 1 is disposed on a base plate 10, a heater 12 is disposed on the inside circumferential wall of a heat insulating layer 11, surrounding a reaction tube 2.

In the heating furnace there is provided a reaction tube 2 which provides a reaction vessel of a double tubular structure for establishing an atmosphere to be processed, which includes an outer tube 21 of, e.g., quartz having the upper end closed, and an inner tube 22 of, e.g., quartz disposed in the outer tube 21 conically with the outer tuber.

The outer tube 21 and the inner tube 22 have the respective lower ends supported by a cylindrical manifold 3. A cap 31 is provided in the opened lower end of the manifold 3 vertically movably to seal the opened lower end of the manifold 3.

A rotary shaft 32 is passed through the center of the cap 31. The rotary shaft 21 is rotatable in air-tight state produced by, e.g., magnetic seal. The rotary shaft 32 has the lower end connected to a rotary mechanism 34 disposed on a lift 33 and has the upper end secured to a turntable 35. A wafer boat 4 of, e.g., quartz is rotatably mounted on the upper side of the turntable 35 through a heat insulating cylinder 40. The wafer boat 4 can hold 150, for example, sheets of wafers W at a certain vertical pitch.

A film forming gas feed pipe 5, a doping gas feed pipe 6 and a crystal nuclear gas feed pipe 7 are inserted in sides of a lower part of the manifold 3. The film forming gas feed pipe 5 and the doping gas feed pipe 6 are connected to gas sources (not shown) through their respective mass flow controllers 51, 61 to supply into the inner tube 22 respectively a film forming gas, e.g., monosilane ($SiH_4$) gas and a doping gas, e.g., phosphine ($PH_3$) gas. The crystal nuclear gas feed pipe 7 is connected to a gas source not shown through a mass flow controller 71 to supply into the inner tube 22 a gas containing components to be a nuclear of silicon crystal, e.g., $N_2O$ gas, $O_2$ gas or $CO_2$ gas.

An exhaust pipe 8 is connected to a side of an upper part of the manifold 3. The exhaust pipe 8 is connected to a vacuum pump 81 and exhausts processing gas through a circumferential gas between the outer tube 21 and the inner tube 22 to set a required low pressure atmosphere in the reaction tube 2.

Next, an embodiment of the film forming method according to the present invention using the above-described film forming apparatus will be explained. First, an atmosphere to be processed is heated by the heater 12 so that a central part (vertically central part) of the wafer boat 4 has, e.g., 580° C., and the lift 38 is lifted to load the wafer boat 4 holding, e.g., 150 sheets of wafers W into the reaction tube 2 through the opened bottom of the reaction tube.

Subsequently the interior of the reaction tube 2 is evacuated by a separately provided vacuum pump to, e.g., a 1 mmTorr vacuum degree. Then monosilane gas and phosphine gas are fed respectively at a 800–1000 SCCM (Standard Cubic Centimeter Per Minute) flow rate and a 150 SCCM flow rate into the inner tube 32 respectively through the film forming gas feed pipe 5 and the doping gas feed pipe 6. At the same time, through the crystal nuclear gas feed pipe 7 $N_2O$ gas, $O_2$ gas, $O_3$ gas or $CO_2$ gas is fed at, e.g., a 1–50 SCCM flow rate into the inner tube incessantly throughout the film forming processing. The interior of the reaction tube 3 is exhausted to have a pressure of e.g., 1.0 Torr, and the wafer boat 4 is set on rotation at, e.g., 1 rpm rotational number by the rotary mechanism 34. The film forming processing is thus conducted for 30 minutes.

By this film forming processing, amorphous silicon film which functions as a resistor doped with phosphorus and is conductive can be formed. This film is annealed at, e.g., 800° C. in, e.g., a different heat treatment apparatus, and polysilicon film can be formed. Such polysilicon film has high sheet resistance uniformity in intra-plane, inter-plane and inter-batch of wafers. The reason for this is considered as follows. That is, $N_2O$ gas is decomposed into Ns and Os near 580° C., and the Os (oxygen) are taken into the polysilicon, or the amorphous silicon film. Then, when the silicon film is annealed to be polycrystallized, the Os in the amorphous silicon film become nuclei of silicon crystals. A number of the nuclei, e.g., Os is so large that the silicon crystals have small and uniform sizes. But when the film is formed near 580° C., the amorphous silicon film is partially polycrystallized, but the polycrystallized part has 0 nuclei. Accordingly the crystal sizes are small and uniform, which is considered to improve resistance value (sheet resistance) uniformity among devices of the silicon film.

Figure 2:
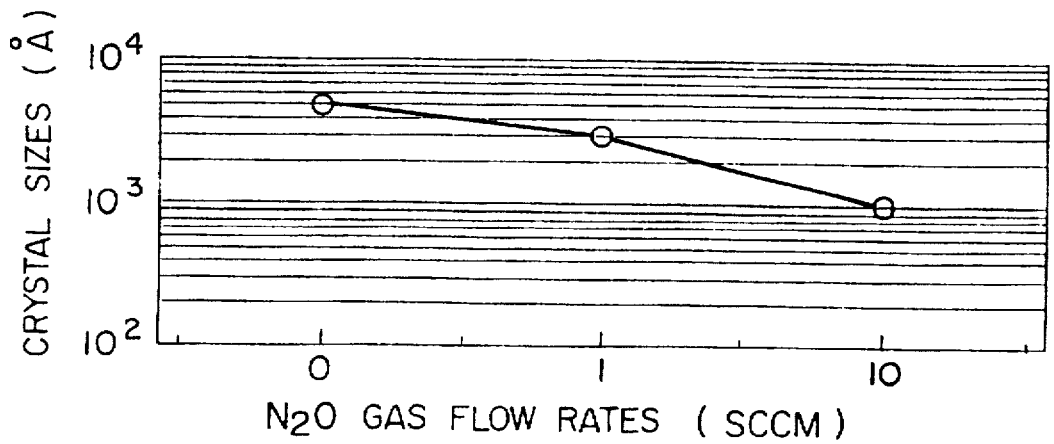
FIG. 2 is a characteristic view of relationships between $N_2O$ gas flow rates (SCCM) of $N_2O$ gas fed into the reaction vessel for hindering growth of silicon crystals, and crystal sizes (Å) of the polysilicon film.

To confirm the effect of the film forming method according to the present invention, silicon crystal sizes in polysilicon films were checked in the case that the crystal nuclear gas was supplied throughout the film forming processing and in the case that the gas was not supplied. FIG. 2 shows the results. The flow rates of $SiH_4$ gas and $PH_3$ gas were respectively 950 SCCM and 130 SCCM, and the annealing temperature was about 950° C.

The results show that $N_2O$ gas (1–100 SCCM) is supplied, whereby the Os (Oxygen) are crystal nuclei, and the silicon crystal sizes (Å) are small. Accordingly when a wafer is cut into discrete devices, the micronized resistor elements of the devices have different crystal numbers, depending on places of the wafer the devices take. But sizes of the crystal are so small that differences in crystal sizes among the micronized resistor elements are small. Accordingly resistance value uniformity among the micronized resistor elements of the polysilicon film is improved.

Figure 3:
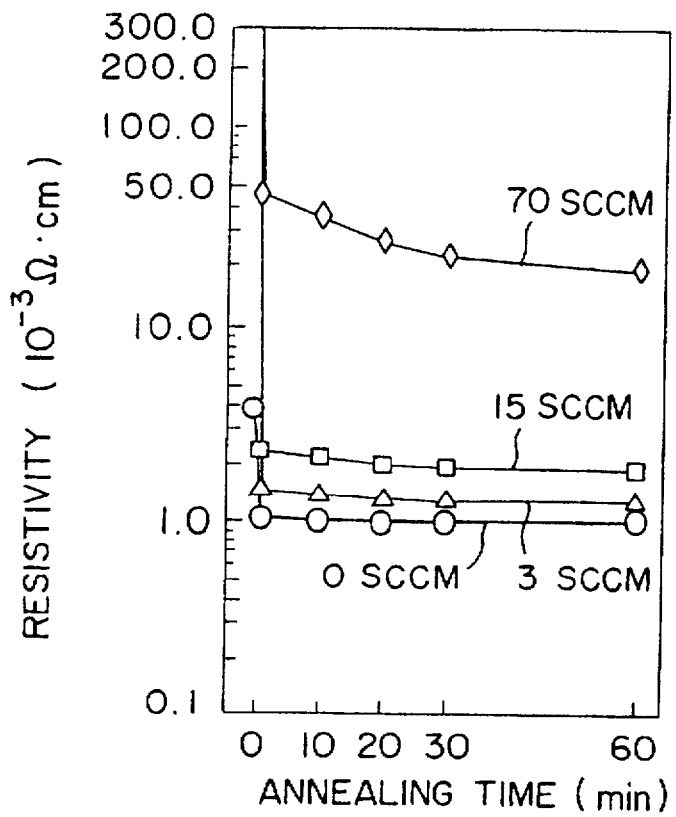
FIG. 3 is a characteristic view of resistance values ($10^{-3}$ Ω·cm) of the polysilicon film, and flow rates of $N_2O$ gas.
Figure 4A:
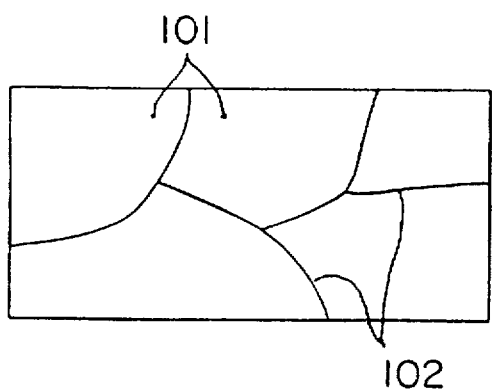
FIGS. 4A and 4B are schematic views of crystal structures of the polysilicon film.
Figure 4B:
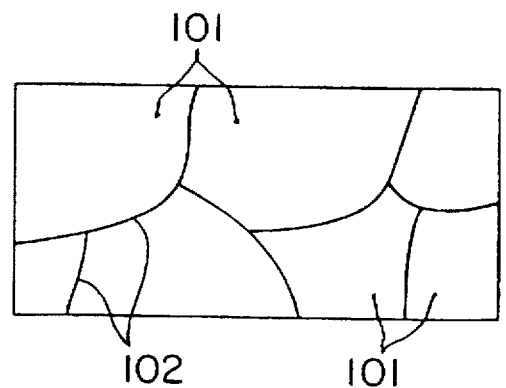

Resistance values of the polysilicon film were checked with flow rates of $N_2O$ gas varied. The results are shown in FIG. 3. The flow rates of $SiH_4$ gas and $Ph_3$ gas were respectively 950 SCCM and 130 SCCM, and the annealing temperature was about 950° C. In FIG. 3, ○, △, □ and ◇ respectively represent a O flow rate of $N_2O$ gas (no $N_2O$ gas was supplied), a 3 SCCM $N_2O$ gas flow rate, a 15 SCCM $N_2O$ gas flow rate and 70 SCCM $N_2O$ gas flow rate. As seen from these results, with increases of an $N_2O$ gas flow rate, the polysilicon film has higher resistance values. This is considered to be because oxygen is taken into the film, whereby growth of silicon crystals delays, and bonding between silicon and phosphorus is insufficient, which results in resistance value increases. This bonding state can be controlled by $N_2O$ gas flow rates, and as a result, resistance values of the polysilicon film can be controlled by $N_2O$ gas flow rates. The annealing is optimally conducted for 30 minutes.

The present invention is not limited to doping polysilicon film with phosphorus, and is applicable to a case of doping B by using, e.g., $BF_3$ gas.and a case of doping B by using $B_2H_2$. The present invention is effective in a case where no impurity is doped because crystal size can be made smaller.

The present invention is not limited to a case where amorphous silicon film is annealed to be polycrystallized, and is applicable to a case where polysilicon film is formed at, e.g., a film forming temperature of 550°–580 C. The film forming process is not limited to batch processing and can be sheet processing.

A gas containing components for forming nuclei of silicon crystals is not limited to $N_2O$ gas, and can be $O_2$ gas, $O_3$ gas, $CO_2$ gas or others. The components may be other than oxygen. Objects to be processed are not limited to wafers and can be glass substrates used in liquid crystal panel fabrication.

According to the film forming method according to the present invention, sizes of crystals of polysilicon film can be made small, whereby high uniformity of inter-device resistance values can be obtained, and high yields can be obtained.

We claim:

1. A method for forming a doped polysilicon film by a thermal CVD process comprising the steps of:

loading objects to be processed into a reaction vessel maintained air-tight;

supplying a film forming gas and a doping gas into the reaction vessel to form silicon films on the objects to be processed by the thermal CVD process; and supplying a gas containing a component which hinders growth of silicon crystals into the reaction vessel incessantly throughout film forming processing, wherein the gas containing the component which hinders growth of silicon crystals is one selected from the group consisting of $N_2O$, $O_2$, $O_3$, and $CO_2$.

2. The film forming method according to claim 1, wherein the film forming gas is monosilane ($SiH_4$) gas.

3. The film forming method according to claim 1, wherein the doping gas is phosphine ($PH_3$) or $B_2H_2$.

* * * * *